(12) United States Patent
Kawakami

(10) Patent No.: US 7,030,938 B2
(45) Date of Patent: Apr. 18, 2006

(54) TUNER AND RECEIVER APPARATUS

(75) Inventor: Satoru Kawakami, Kanagawa (JP)

(73) Assignee: Sony Corporation, Tokyo (JP)

( * ) Notice: Subject to any disclaimer, the term of this patent is extended or adjusted under 35 U.S.C. 154(b) by 686 days.

(21) Appl. No.: 10/052,984

(22) Filed: Nov. 7, 2001

(65) Prior Publication Data
US 2002/0118309 A1  Aug. 29, 2002

(30) Foreign Application Priority Data
Nov. 9, 2000  (JP) ............................. P2000-341983

(51) Int. Cl.
*H04N 5/50* (2006.01)

(52) U.S. Cl. ...................................... 348/731

(58) Field of Classification Search ................ 348/731, 348/725, 554, 552, 732, 558; 334/85
See application file for complete search history.

(56) References Cited

U.S. PATENT DOCUMENTS

| | | | | | |
|---|---|---|---|---|---|
| 4,841,414 | A | * | 6/1989 | Hibino et al. ............... | 361/818 |
| 4,921,465 | A | * | 5/1990 | Hietala et al. ............. | 455/193.3 |
| 5,162,822 | A | * | 11/1992 | Wakamori ................... | 333/193 |
| 5,483,413 | A | | 1/1996 | Babb ........................... | 361/220 |
| 5,898,909 | A | * | 4/1999 | Yoshihara et al. ............. | 455/73 |
| 6,236,437 | B1 | * | 5/2001 | Suzuki et al. ................ | 348/731 |
| 6,434,171 | B1 | * | 8/2002 | Ishida ......................... | 370/537 |
| 6,487,182 | B1 | * | 11/2002 | Kitazato ...................... | 370/315 |
| 6,490,001 | B1 | * | 12/2002 | Shintani et al. ............. | 348/554 |
| 6,714,264 | B1 | * | 3/2004 | Kempisty .................... | 348/732 |
| 6,737,945 | B1 | * | 5/2004 | Kawai .......................... | 334/85 |

FOREIGN PATENT DOCUMENTS

| | | |
|---|---|---|
| DE | 19630720 | 7/1996 |
| DE | 19649433 | 11/1996 |
| EP | 0932252 | 1/1999 |
| JP | 2000-332143 | * 10/2000 |

OTHER PUBLICATIONS

Designing For EMI Regulatory Compliance, Ed Fong and Scott Bobo; Revised Apr. 13, 1999, Copyright 1999 Tripath Technology, Inc. (8 pgs).*

Armstrong, M.K, PCB design techniques for lowest-cost EMC compliance: Part 1, *Electronics & Communication Engineering Journal*, Aug. 1999, pp. 185-194.

* cited by examiner

*Primary Examiner*—Paulos M. Natnael
(74) *Attorney, Agent, or Firm*—Jay H. Maioli

(57) ABSTRACT

A tuner and receiver apparatus that can output first transport stream data and second transport stream data having excellent bit error rate characteristics for two systems even when a first tuner portion and a second tuner portion are provided on one board. A first tuner portion is provided on one surface of a board, and a second tuner portion is provided on the other side of the board.

6 Claims, 6 Drawing Sheets

TUNER AND RECEIVER APPARATUS

BACKGROUND OF THE INVENTION

1. Field of the Invention

The present invention relates to a tuner apparatus having plural tuner portions that receive plural different broadcast waves respectively, and a receiver apparatus.

2. Description of the Related Art

Recently, digital broadcasts such as BS (Broadcasting Satellite) digital broadcast or CS (Communication Satellite) digital broadcast have been propagating. In order to receive these broadcasts, special receivers that are exclusively used to receive these broadcasts respectively are required. For example, each of these receivers is connected to a television set or the like, and sounds/pictures are output/displayed on the basis of the broadcast waves thus received. Recently, the number of enterprising companies that provide broadcast services of BS broadcast, CS broadcast, etc. has rapidly increased. Under such a situation, it has been required that a user can receive plural broadcasts by using only one receiver.

In order to satisfy this requirement, a receiver having a tuner having a function of receiving plural broadcasts has been proposed and known as one of conventional receivers. The tuner is equipped with plural tuner portions which are designed to be integrated with one another and each of which has a function of outputting transport stream data obtained by multiplexing encoded data on sounds and pictures contained in broadcast waves received, for example. As the construction of the conventional tuner, plural tuner portions are provided on the same surface of one board from the viewpoint of an easy manufacturing process thereof.

The construction of the tuner as described above has a merit in the point that the plural tuner portions can be accommodated in a compact style in the tuner, however, it has a problem in the point that the tuner portions suffer undesired radiation noises from one another because they are disposed to be approximate to one another. Accordingly, there may occur such a case that each of the plural tuner portions cannot output transport stream data having excellent bit error rate characteristics from the broadcast waves on sounds and pictures received. In order to avoid the problem of the undesired radiation noises as described above, there may be proposed a method of providing shielding between the plural tuner portions. In this case, the number of parts is increased, and the cost for the shielding parts is especially needed, so that the overall cost of the receiver is increased. In addition, when wire patterns of wires drawn out from the respective tuner portions exist on the same surface of the board, it is difficult to carry out the layout design of the wire patterns on the board.

Therefore, the present invention has an object to solve the above problem, and provide a tuner and receiver apparatus which can output two systems of first transport stream data and second transport stream data having excellent bit error rate characteristics even when a first tuner portion and a second tuner portion are provided on one board.

SUMMARY OF THE INVENTION

According to the present invention, a first tuner portion is provided on one surface of a board, and a second tuner portion is provided on the other surface of the board. Therefore, the first tuner portion and the second tuner portion are hardly influenced by undesired radiation noises due to existence of the board. Accordingly, the tuner apparatus can output two systems of first transport stream data and second transport stream data having excellent bit error rate characteristics from the first tuner portion and the second tuner portion respectively even when the first tuner portion and the second tuner portion are provided on one board.

According to the present invention, since the distance between the first tuner portion and the second tuner portion is further increased, each of the first tuner portion and the second tuner portion is more hardly influenced by the undesired radiation noises from the other tuner portion According to the present invention, the distance between the first tuner portion and the second tuner portion is further increased, each of the first and second tuner portions is more hardly influenced by the undesired radiation noises from the other tuner portion.

According to the present invention, the first wire pattern and the second wire pattern are separately provided on different surfaces of the board, so that these wire patterns are prevented from crossing each other on the same surface of the board. Therefore, in the tuner apparatus, the first transport stream data transmitted by the first wire pattern and the second transport stream data transmitted by the second wire pattern are separately transmitted, so that these transport stream data can be suppressed from being influenced by each other. Further, in the tuner apparatus, the first wire pattern and the second wire pattern are formed on the different surfaces of the board, so that it is easy to lay out the first and second wire patterns, and it is also easy to form the first and second wire patterns on the board.

According to the present invention, at least one-layer ground layer can efficiently intercept the undesired radiation noises of the first and second tuner portions. Accordingly, the first tuner portion and the second tuner portion are hardly influenced by the undesired radiation noises, so that they can output the first and second transport stream data having the excellent bit error rate characteristics.

According to the present invention, the first ground layer and the second ground layer can efficiently intercept the undesired radiation noises of the first tuner portion and the second tuner portion. Accordingly, the first tuner portion and the second tuner portion are hardly influenced by the undesired radiation noises from each other. Therefore, the first and second transport stream data having more excellent bit error rate characteristics can be output.

According to the present invention, a complicated manufacturing step is unnecessary, so that a four-layer board can be easily manufactured at a low cost.

According to the present invention, the first tuner portion of the tuner apparatus is provided on one surface of the board, and the second tuner portion is provided on the other surface of the board, so that the first tuner portion and the second tuner portion are hardly influenced by undesired radiation noises from each other because of existence of the board. Accordingly, in the tuner apparatus, the two systems of first transport stream data and second transport stream data having excellent bit error rate characteristics can be output from the first tuner portion and the second tuner portion even when the first tuner portion and the second tuner portion are provided on one board. The first and second transport stream data that are encoded are decoded by decoding means, and output from an output terminal. The display device can output fine sounds and pictures on the basis of the first and second transport stream data having the excellent bit error rate characteristics.

According to the present invention, the receiver apparatus can record in the recording means at least one of the first and second transport stream data having the excellent bit error rate characteristics which is selected by the selecting means. Accordingly, the receiver apparatus can store at least one of the first and second transport stream data having the excellent bit error rate characteristics in the recording means. Further, the receiver apparatus can output at least one of the first and second transport stream data from the output terminal to the display device while the one of the first and second transport stream data are recorded into the recording means.

DETAILED DESCRIPTION OF THE PREFERRED EMBODIMENTS

Preferred embodiments according to the present invention will be described hereunder in detail with reference to the accompanying drawings.

The following embodiments are preferred embodiments of the present invention, and thus various technically favorable limitations are imposed on the embodiments. However, the present invention is not limited to these embodiments insofar as there is no special description on the limitation of the present invention in the following description.

Figure 1:
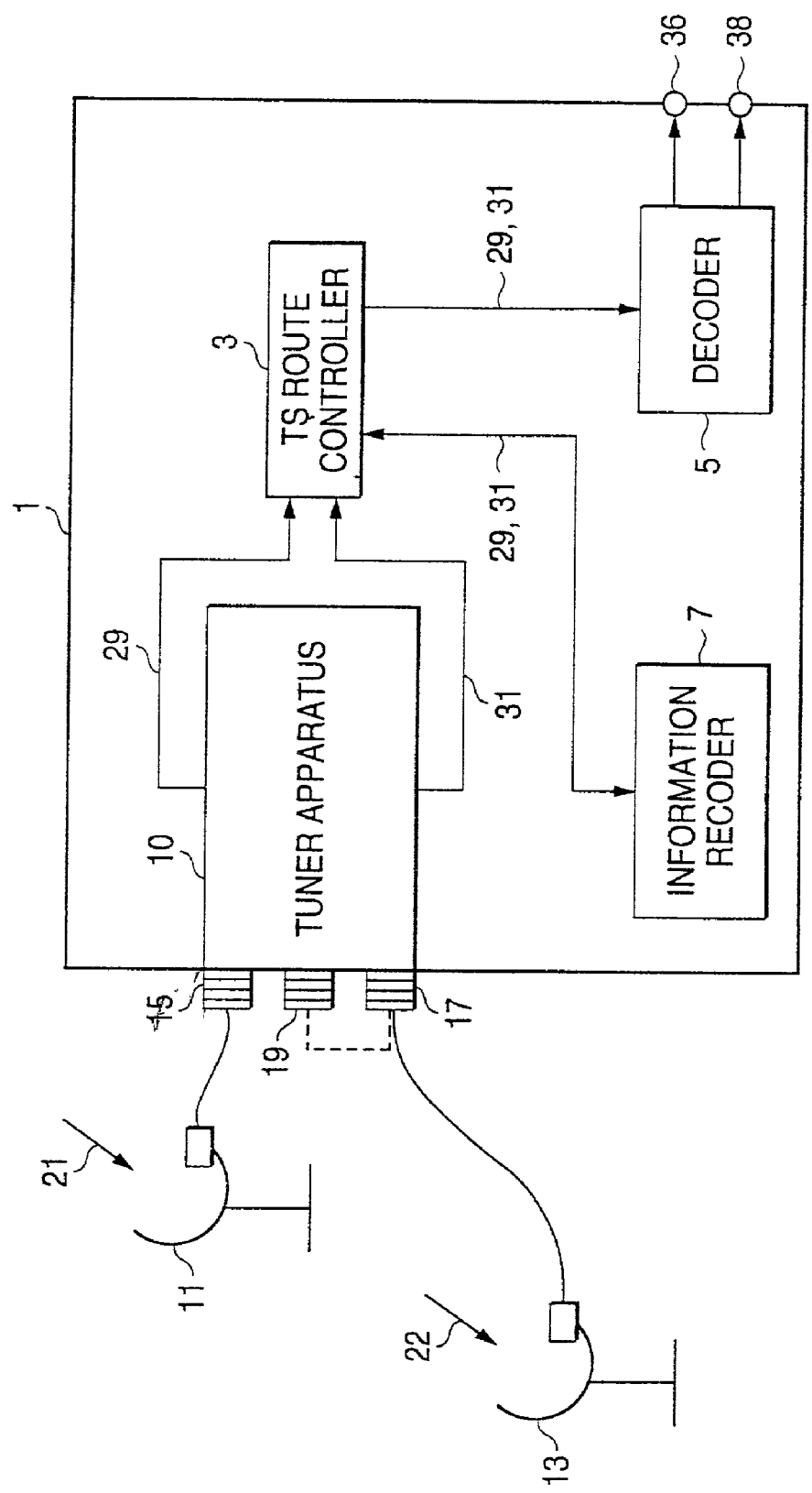
FIG. 1 is a block diagram showing the construction of a receiver apparatus having a tuner apparatus according to an embodiment of the present invention.

FIG. 1 is a block diagram showing the electrical construction of a receiver apparatus 1 having a tuner apparatus 10 to which an embodiment of the present invention is applied.

The receiver apparatus 1 has a function of receiving high-frequency signals of digital broadcasts such as BS (Broadcasting Satellite) digital broadcasts or CS (Communication Satellite) digital broadcasts (hereinafter merely referred to as "broadcast wave"). Further, the receiver apparatus 1 has a function of decoding encoded data on encoded pictures/sounds contained in the broadcast waves to display the pictures/sounds on a television set (display device) (not shown) connected to the receiver 1 and further record these pictures/sounds in a predetermined information recording medium.

Next, the specific construction of the receiver apparatus 1 will be described.

The receiver apparatus 1 has a board 34, a first antenna signal input terminal 15, a second antenna signal input terminal 17, a tuner apparatus 10, a transport stream route controller 3 (selecting means), a decoder 5 (decoding means), an audio output terminal 36 (output terminal) and a video output terminal 38 (output terminal), and preferably it is further equipped with an information recorder (recording means) 7 and an antenna signal output terminal 19. In the following description, the transport stream route controller is abbreviated as a TS route controller.

A first antenna 11 is connected to the first antenna signal input terminal 15, and a second antenna 13 is connected to the second antenna input terminal 17. The first antenna 11 and the second antenna 13 have functions of receiving different broadcasts, for example, a first broadcast wave 21 of the BS digital broadcast and a second broadcast wave 22 of the CS digital broadcast, respectively.

The tuner apparatus 10 is equipped with the first antenna signal input terminal 15, an antenna signal output terminal 19, and a second antenna input terminal 17, and the first broadcast wave 21 and the second broadcast wave 22 are input to the tuner apparatus 10. The tuner apparatus 10 is connected to the TS route controller 3, and outputs first transport stream data 29 and second transport stream data 31 as transport stream outputs of two different systems to the TS route controller 3. The first transport stream data 29 and the second transport stream data 31 correspond to data formats used when pictures/sounds of plural programs are multiplexed in the digital broadcast, and thus they are multiplexed data on the pictures/sounds contained in the first broadcast wave 21 and the second broadcast wave 22. These first and second transport stream data 29 and 31 are encoded data.

The TS route controller 3 is further connected to the decoder 5 and the information recorder 7. The TS route controller 3 selects to output each of the first and second transport stream data 29 and 31 to the decoder 5, or output and record these data to and into the information recorder 7. Accordingly, the TS route controller 3 can decode the second transport stream data 31 into the decoder 5 while recording the first transport stream data 29 into the information recorder 7 or do the inverse processing thereto. That is, the receiver apparatus 1 can record the encoded data on pictures/sounds contained in the second broadcast wave 22 into the information recorder 7 while displaying the pictures/sounds contained in the first broadcast wave 21 on a television set, or carry out the inverse processing thereto, for example.

The decoder 5 has a function of decoding the encoded first transport stream data 29 and the encoded second transport stream data 31. Specifically, the decoder 5 carries out the decoding operation according to MPEG (Moving Picture Experts Group) 2. Thereafter, the first transport stream data 29 and the second transport stream data 31 are respectively encoded on the basis of the NTSC (National Television System Committee) system to be converted to video data/audio data. The decoder 5 is connected to a video output terminal 38 and an audio output terminal 36 exposed to the outside of the receiver apparatus 1, and the video data and the audio data of the NTSC system are output from the video output terminal 38 and the audio output terminal 36, respectively. These video data and the audio data are input to the video input terminal and the audio input terminal of the television set (not shown), whereby the pictures/sounds are output from the television set.

Figure 2C:
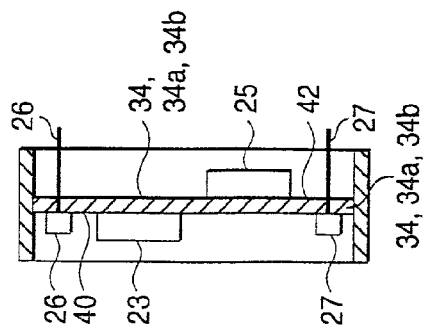
FIGS. 2A to 2E are plan, side and cross-sectional views of the construction of a tuner apparatus of FIG. 1.
Figure 2A:
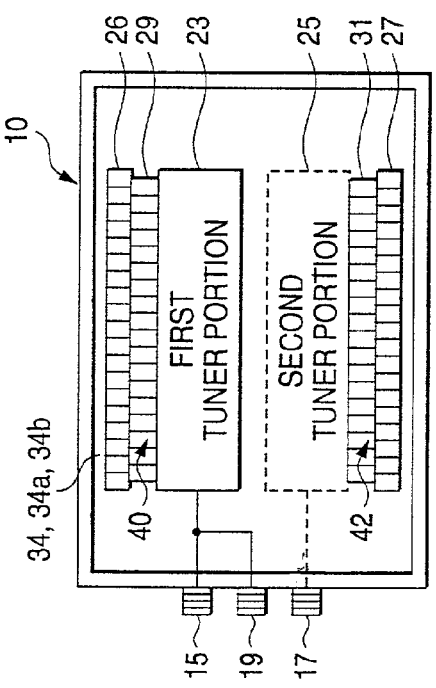
Figure 2D:
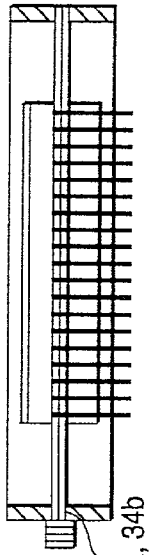
Figure 2E:
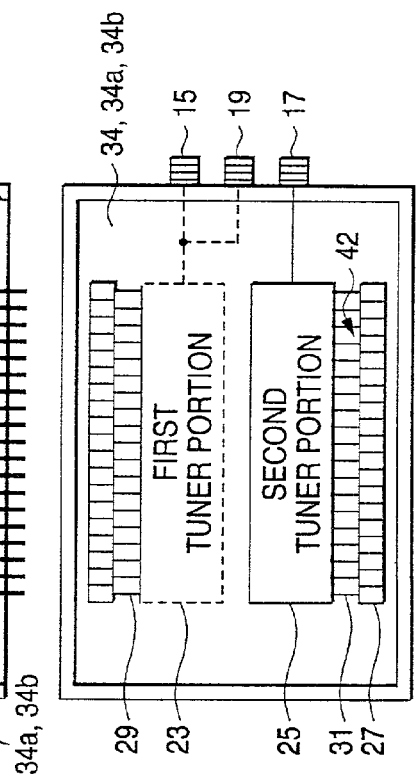
Figure 2B:
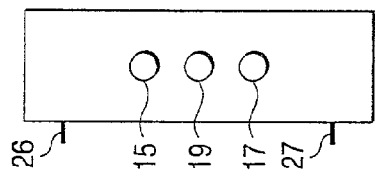

FIG. 2A is a plan view showing the construction of the tuner apparatus 10 of FIG. 1 when it is viewed from the top side, FIG. 2B is a plan view showing the construction of the tuner apparatus 10 of FIG. 2A when it is viewed from the front side, FIG. 2C is a plan view showing the construction of the tuner apparatus 10 of FIG. 2A when it is viewed from the back side, FIG. 2D is a side cross-sectional view showing the construction of the tuner apparatus 10 of FIG. 2A when it is viewed from one side, and FIG. 2E is a plan view showing the construction of the tuner apparatus 10 of FIG. 2A when it is viewed from the back side. The members indicated by dotted lines in FIGS. 2A and 2E are located at the back side of the board 34.

The tuner apparatus 10 has the first antenna signal input terminal 15, the antenna signal output terminal 19 and the second antenna input terminal 17, and also has a first tuner portion 23, a first wire pattern 40, a first output terminal 26, a second tuner portion 25, a second wire pattern 42, a second output terminal 27 and the board 34.

The first tuner portion 23 and the second tuner portion 25 have substantially the same function except that they receive different broadcast waves and are provided in different arrangements, and thus the function of the first tuner portion 23 will be mainly described.

The first tuner portion 23 has a function of multiplexing the decoded data on the pictures/sounds contained in the first broadcast wave 21 received to generate the first transport stream data 29. The first transport stream data 29 are transmitted by the first wire pattern 40 and output from the first output terminal 26. Likewise, the second transport stream data 31 are transmitted by the second wire pattern 42 and output from the second output terminal 27.

Here, the tuner apparatus 10 is characterized in that the first tuner portion 23 is provided on one surface of the board 34 and the second tuner portion 25 is provided on the other surface of the board 34. Because of the presence of the board 34, this arrangement brings the tuner apparatus 10 with an effect that the first and second transport stream data 29 and 31 output from the first tuner portion 23 and the second tuner portion 25 respectively are not mutually influenced by undesired radiation noises therefrom because the first and second tuner portions 23 and 25 are not located so as to be approximate to each other. Here, the board 34 is formed of insulating material, and for example it is formed of glass epoxy base material.

Figure 3A:
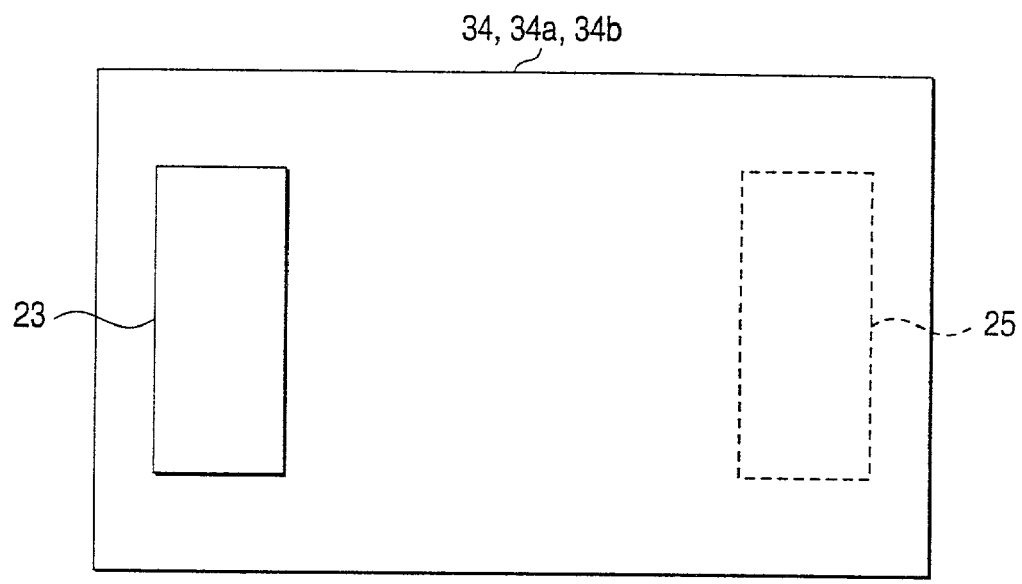
FIGS. 3A, 3B are plan views showing arrangements of first and second tuner portions on a board.
Figure 3B:
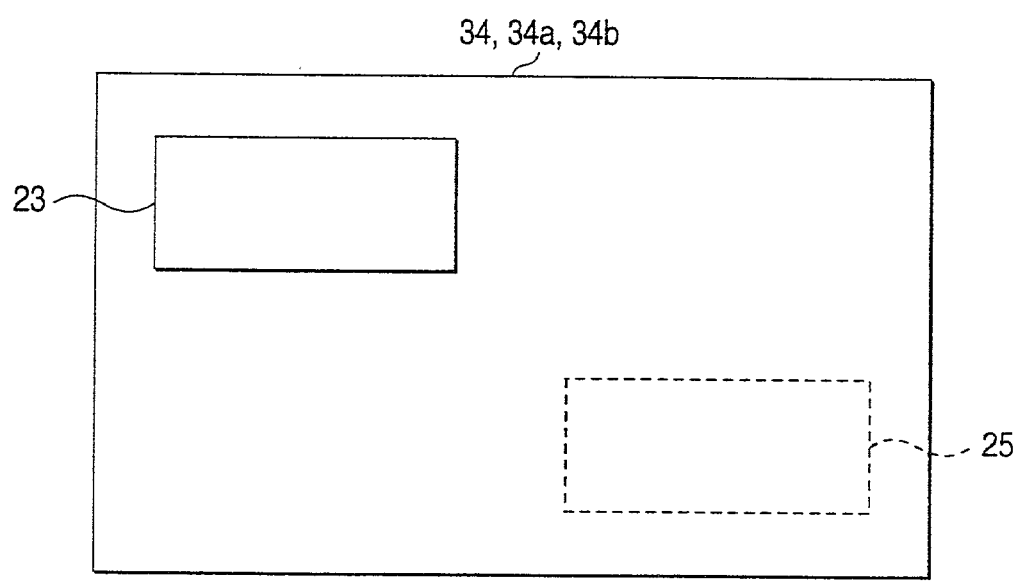

The first tuner portion 23 and the second tuner portion 25 are preferably arranged so that they are not confronted to each other through the board 34. That is, the first tuner portion 23 and the second tuner portion 25 are arranged so as to be displaced from each other so that they are not confronted to each other through the board 34. This arrangement enables the tuner apparatus 10 to prevent the influence of the undesired radiation noises more greatly. Further, as shown in FIGS. 3A and 3B, the first tuner portion 23 and the second tuner portion 25 may be provided in the neighborhood of both the ends of the board 34. This arrangement enables the tuner apparatus 10 to have the same effect as described above.

Further, in the receiver apparatus 1, the first wire pattern 40 and the second wire pattern 42 are disposed on different surfaces of the board 34 as in the case of the first tuner portion 23 and the second tuner portion 25, so that the first and second wire patterns 40 and 42 are prevented from crossing each other on the same plane of the board 34. Therefore, the first wire pattern 40 and the second wire pattern 42 are liable to be formed on the different surfaces of the board 34.

The arrangement of the first and second wire patterns 40 and 42 on the difference surfaces of the board 34 as described above also brings such a merit that the layout design of the first and second wire patterns 40 and 42 can be made easy.

Here, the antenna output terminal 19 is electrically connected to the first antenna signal input terminal 15 as shown in FIG. 2A, and the second antenna input terminal 17 and the antenna output terminal 19 may be short-circuited to each other by an external cable or the like so that the first broadcast wave 22 received by the first antenna 11 is input to the second tuner portion 25. That is, the same broadcast wave may be input to the first tuner portion 23 and the second tuner portion 25.

Further, the board 34 may be a board 34a having the following construction. That is, as shown in the cross-sectional view of FIG. 4, the board 34a has a first wire pattern layer 41 having a first wire pattern 40 formed thereon, a second wire pattern layer 43 having a second wire pattern 42 formed thereon and an insulating layer 47 sandwiched between the first wire pattern layer 41 and the second wire pattern layer 43, and a ground layer 45 formed of at least one layer is formed in the insulating layer 47. The ground layer 45 has a function of intercepting undesired radiation noises of the first tuner portion 23 and the second tuner portion 25. Copper foil may be used as the material of the ground layer 45.

With this construction, the first transport stream data 29 output from the first tuner portion 23 and the second transport stream data 31 output from the second tuner portion 25 in the tuner apparatus 10 are prevented from being mutually influenced by the undesired radiation noises thereof.

Further, the board 34 may be a board 34b having the following construction.

Figure 5:
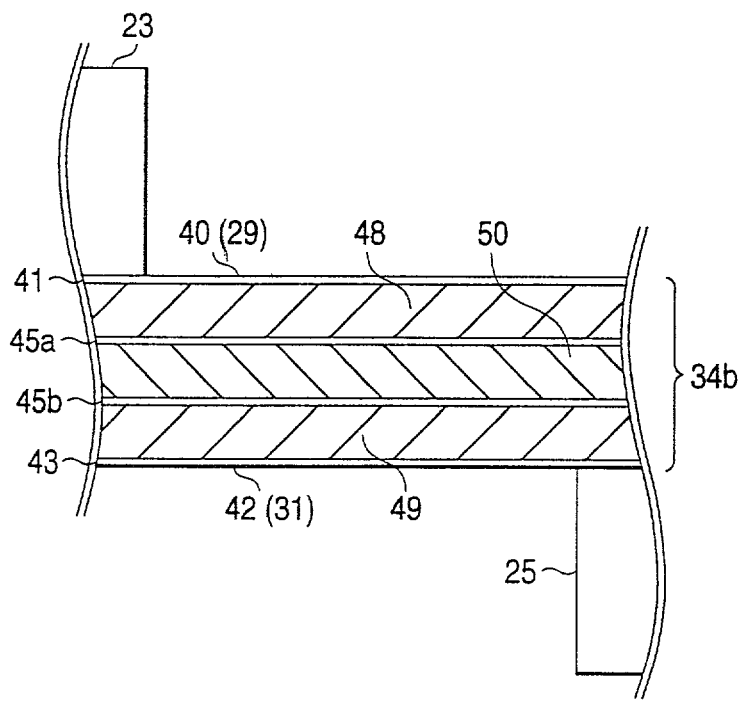
FIG. 5 is a cross-sectional view showing the sectional construction of the board on which the first tuner portion and the second tuner portion are provided.

That is, as shown in the cross-sectional view of FIG. 5, the board 34b has a second wire pattern layer 43 having a second wire pattern 42 formed thereon, a second insulating layer 49, a second ground layer 45b, an intermediate insulating layer 50, a first ground layer 45a, a first insulating layer 48, a second wire pattern layer 43 having a second wire pattern 42 formed thereon and a first wire pattern layer 41 having a first wire pattern 40 formed thereon. Here, the intermediate insulating layer 50, the first insulating layer 48 and the second insulating layer 49 are formed of the same material as the insulating layer 47.

The first ground layer 45a and the second ground layer 45b have a function of intercepting the undesired radiation noises from the first tuner portion 23 and the second tuner portion 25. For example, copper foil may be used as the material of the first ground layer 45a and the second ground layer 45b. The same material may be used for signal lines through which signals are transmitted.

If the board 34 has the same construction as the board 34b, the first ground layer 45a and the second ground layer 45b can more efficiently intercept the undesired radiation noises from the first tuner portion 23 and the second tuner portion 25.

Figure 6:
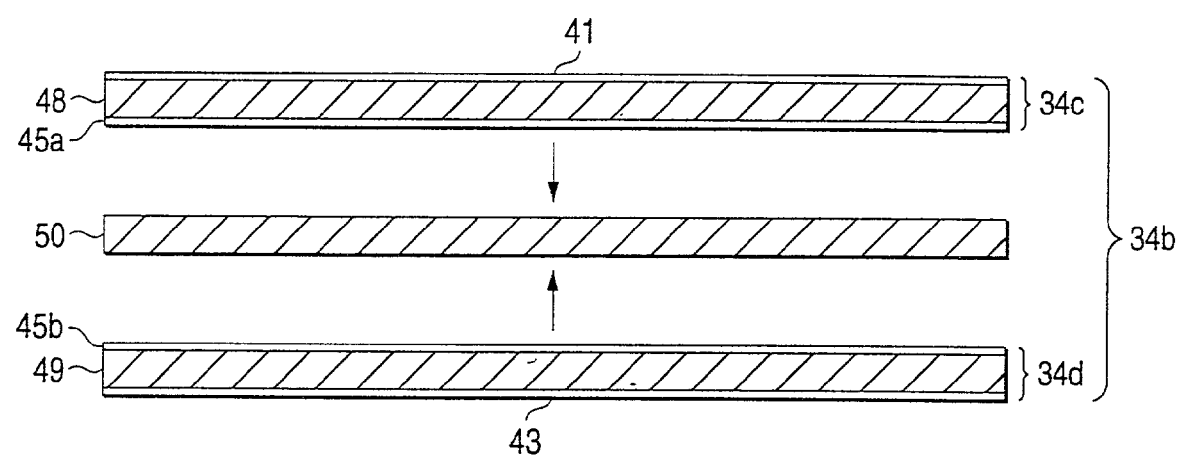
FIG. 6 is a cross-sectional view showing an example of a fabricating method of the board of FIG. 5.

Further, the board 34b may be formed by sandwiching an intermediate insulating layer 50 (third insulating layer) between a first board 34c with a first insulating layer 48 having a first wire pattern layer 41 and a first ground layer 45a formed on the difference surfaces thereof and a second board 34d with a first insulating layer 49 having a second wire pattern layer 43 and a second ground layer 45b formed on the difference surfaces thereof as shown in FIG. 6.

Figure 7:
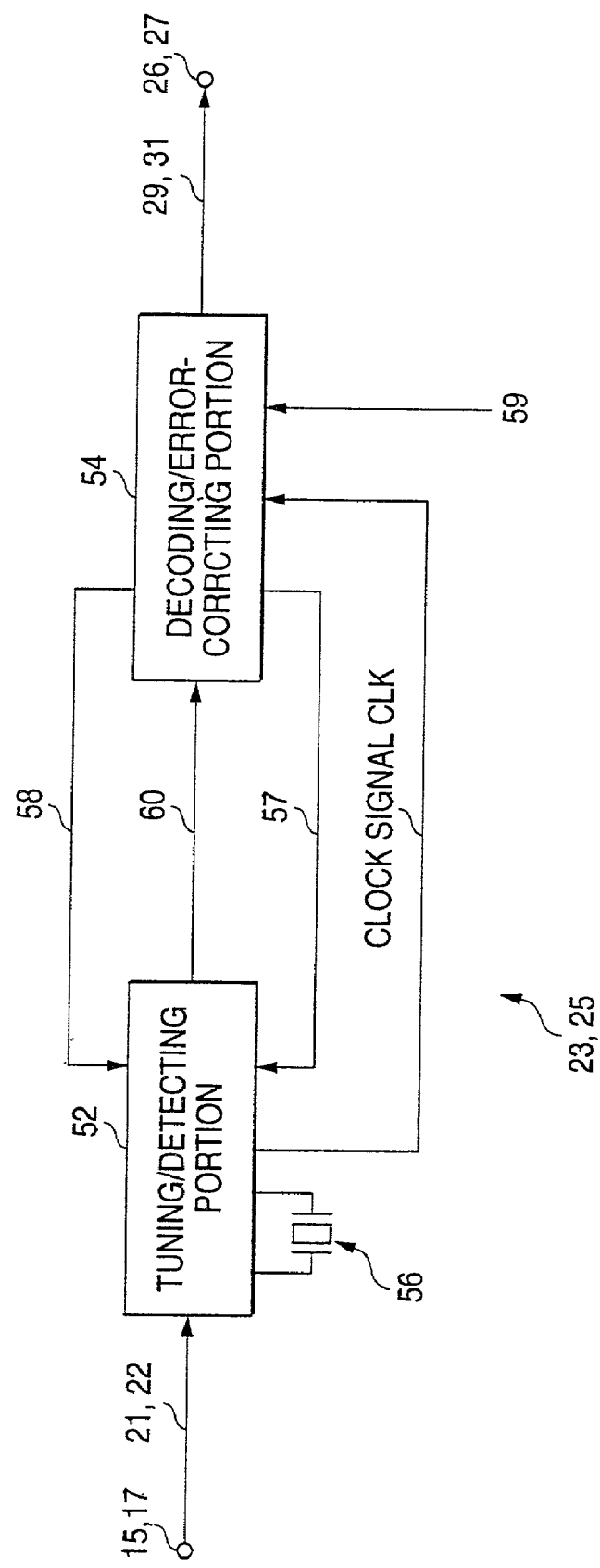
FIG. 7 is a block diagram showing the construction of the first tuner portion shown in FIG. 2A.

FIG. 7 is a block diagram showing the electrical construction of the first tuner portion 23 of FIG. 2A. The second tuner portion 25 has substantially the same electrical construction as the first tuner portion 23, and thus the description thereof is omitted.

The tuner apparatus 10 has a tuning/detecting portion 52 and a demodulating/error-correcting portion 54. The tuning/detecting portion 52 is equipped with an amplifier and PLL (Phase Locked Loop) circuit and has a function of tuning and detecting the first broadcast wave 21 input from the first antenna signal input terminal 15. The tuning/detecting portion 52 is equipped with an oscillator 56 having a piezoelectric vibrating element, and the oscillator 56 generates clock signals CLK at a fixed period. The clock signals CLK are also supplied to the demodulating/error-correcting portion 54, and the tuning/detecting portion 52 and the demodulating/error-correcting portion 54 are mutually synchronized with each other. The tuning/detecting portion 52 demodulates the input first broadcast wave 21 into I signal and Q signal (hereinafter referred to as "I/Q signal"), and outputs the I/Q signal 60 to the demodulating/error-correcting portion 54.

The demodulating/error-correcting portion 54 has an A/D (Analog To Digital) converting circuit, a QPSK (Quadrature Phase Shift Keying) demodulating circuit and an error correcting (FEC: Forward Error Correction) circuit (not shown), for example, and it is controlled on the basis of a control signal 59 from a control bus (not shown). The demodulating/error-correcting portion 54 outputs the control signal 57 to the tuning/detecting portion 52 to control the tuning/detecting portion 52. Further, the demodulating/error-correcting portion 54 outputs an AGC (Automatic Gain Control) signal 58 to the tuning/detecting portion 52 to output an AGC control voltage so that the level of the I/Q signal 60 input to the demodulating/error-correcting portion 54 is fixed even when the signal level input to the tuning/detecting portion 52 varies, thereby making the gain of the amplifier of the tuning/detecting portion 52 variable.

The A/D converting circuit carries out the A/D (Analog To Digital) conversion on the I/Q signal 60 input. The QPSK demodulating circuit has a function of conducting the QPSK demodulation on a bit stream which is a data sequence (bit sequence) of encoded compressed information. "PSK-"means a phase modulation system for transmitting information by using the phase of broadcast waves corresponding to high-frequency signals with which the information is transmitted. BPSK, QPSK, 8PSK exist as PSK. In this case, QPSK is used. QPSK enables transmission of 2 bits per symbol. For example, the BS digital broadcast utilizes a time-divisional multiplexing system for transmitting 8/4/2PSK modulation waves while multiplexing the modulation waves at a fixed time interval.

The error correcting circuit has a prescribed register, and rewrites data stored in the register while referring to the error correction codes, thereby correcting the bit errors of the first transport stream data 29 and the second transport stream data 31. The transport stream data such as the first transport stream data 29 and the second transport stream data 31 are suitably used for transmission/accumulation under such an environment that occurrence of bit errors, etc. is expected.

The receiver apparatus 1 has the construction as described above, and the operation thereof will be next described with reference to FIGS. 1 to 7.

The receiver apparatus 1 of FIG. 1 has a function of receiving plural broadcasts, and for example it receives the first broadcast wave 21 and the second broadcast wave 22 through the first antenna 11 and the second antenna 13. The first broadcast wave 21 and the second broadcast wave 22 thus received are input to the tuner apparatus 10 from the first antenna signal input terminal 15 and the second antenna signal input terminal 17 respectively. As shown in FIG. 2, in the tuner apparatus 10, plural tuner portions, for example, two tuner portions (first tuner portion 23 and second tuner portion 25) are provided on the difference surfaces of the board 34, 34*a*, 34*b*.

The first broadcast wave 21 and the second broadcast wave 22 are input to the first tuner portion 23 and the second tuner portion 25, respectively. The first tuner portion 23 and the second tuner portion 25 have substantially the same function except that they process different broadcast waves, and thus with respect to the parts having the same functions, the description thereof will be mainly described on only the first tuner portion 23. In the first tuner portion 23 of FIG. 7, the first broadcast wave 21 input is processed as described above, and the I/Q signal 60 is output to the demodulating/error-correcting portion 54. In the demodulating/error-correcting portion 54, the I/Q signal 60 is A/D-converted under the control of the control signal 59, and further subjected to the QPSK modulation, etc., and then the first transport stream data 29 are output.

The first transport stream data 29 are transmitted by the first wire pattern 40 formed in any one of the different surfaces of the board 34, 34*a*, 34*b* as shown in FIG. 2A. On the other hand, the second transport stream data 31 are transmitted by the second wire pattern 42 formed on the surface of the board 34, 34*a*, 34*b* which is different from the surface on which the first wire pattern 40 is provided as shown in FIG. 2E. Accordingly, the first transport stream data 29 transmitted by the first wire pattern 40 and the second transport stream data 31 transmitted by the second wire pattern 42 are perfectly separated from each other by the board 34, 34*a*, 34*b*, so that they are not influenced by each other.

As shown in FIG. 1, the route for each of the first transport stream data 29 and the second transport stream data 31 is selected by the TS route controller 3, and it is recorded in the information recorder 7 or decoded in the decoder 5 and then output to the audio output terminal 36 or the video output terminal 38. Each of the first transport stream data 29 and the second transport stream data 31 recorded in the information recorder 7 may be read out through the TS route controller 3, and decoded in the decoder 5. That is, the receiver apparatus 1 can implement the function of a data recording/reproducing apparatus like a so-called video deck using the information recorder 7 as a hard disk, whereby a user can view/listen to pictures and sounds recorded thereon.

The audio output terminal 36 and the video output terminal 38 are connected to an audio input terminal and a video input terminal of a TV set (not shown). The sounds and the pictures are displayed on the basis of the first transport stream data 29 and/or the second transport stream data 31 on the display area of the TV set. Here, it is needless to say that the TV set may divide the display area into plural sub areas in the vertical and lateral directions to display the pictures on plural broadcast programs on these sub areas, respectively.

According to the preferred embodiments according to the present invention, as shown in FIG. 2A, the first tuner portion 23 and the second tuner portion 25 are provided on the different surfaces of the board 34, 34*a*, 34*b*, and they are prevented from being mutually influenced by the undesired radiation noises output therefrom. In addition, these preferred embodiments need no complicate construction, and thus they can be implemented at a low cost. If the first tuner portion 23 and the second tuner portion 25 are disposed in the neighborhood of both the ends on the different surfaces of the board 34, 34*a*, 34*b* as shown in FIGS. 3A and 3B, the distance between the first tuner portion 23 and the second tuner portion 25 is further increased, so that they are more greatly prevented from being mutually influenced by the undesired radiation noises output therefrom.

Figure 4:
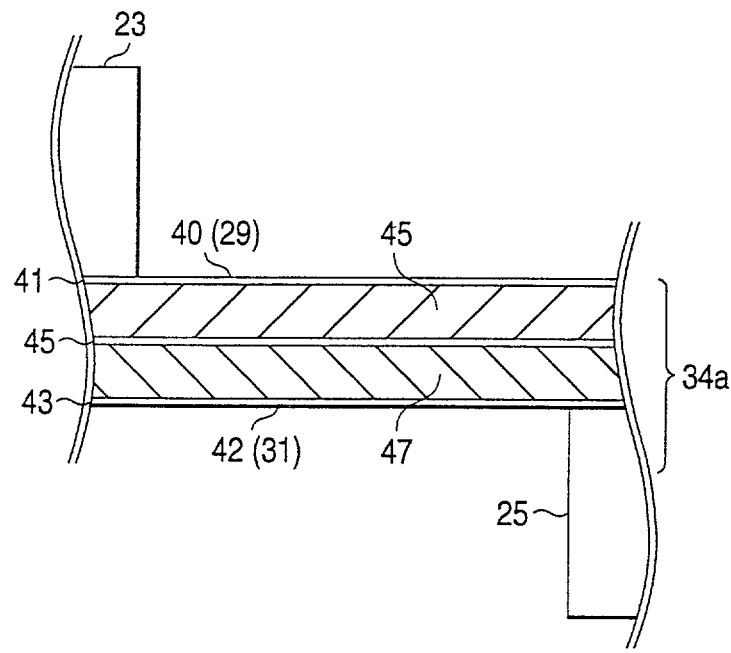
FIG. 4 is a cross-sectional view showing the sectional construction of the board on which the first tuner portion and the second tuner portion are provided.

Further, according to the tuner apparatus 10, if the board 34 having the first tuner portion 23 and the second tuner portion 25 formed on the difference surfaces thereof is designed to have the same construction as the board 34*a* shown in FIG. 4 or the board 34b shown in FIG. 5, each of the first tuner portion 23 and the second tuner portion 25 can be more greatly suppressed from being influenced by the undesired radiation noises output from the other tuner portion.

Accordingly, according to the preferred embodiments of the present invention, even when the first tuner portion 23 and the second tuner portion 25 are provided on one board 34, 34a, 34b, the first transport stream data 29 and the second transport stream data 31 of the two systems having the excellent bit error rate characteristics can be achieved as output results.

The present invention is not limited to the above embodiments, and the construction of each of the embodiments may be partially omitted or arbitrarily modified. Further, the respective parts of the embodiments may be arbitrarily combined with one another.

What is claimed is:

1. A tuner apparatus comprising:
   a first tuner portion for receiving a first broadcast wave and outputting first transport stream data achieved by multiplexing encoded data, on sounds and/or pictures contained in the first broadcast wave; and
   a second tuner portion for receiving a second broadcast wave different from the first broadcast wave and outputting second transport stream data achieved by multiplexing encoded data on sounds and/or pictures contained in the second broadcast wave, said first and second tuner portions being provided on a circuit board, wherein said first tuner portion is provided on one surface of said circuit board and said second tuner portion is provided on a reverse surface of said circuit board,
   wherein a first wire pattern for transmitting the first transport stream data is formed on the surface of said circuit board on which said first tuner portion is provided, and a second wire pattern for transmitting the second transport stream data is formed on the reverse surface of said circuit board on which said second tuner portion is provided,
   wherein said circuit board has a first wire pattern layer on which said first wire pattern is formed, a second wire pattern layer on which said second wire pattern is formed, and an insulating layer sandwiched between said first wire pattern layer and said second wire pattern layer, and at least one ground layer for intercepting undesired radiation noises of said first tuner portion and said second tuner portion formed on said insulating layer, and
   wherein said ground layer has a first ground layer formed so as to confront said first wire pattern layer so that a first insulating layer corresponding to a part of said insulating layer is sandwiched between said first ground layer and said first wire pattern layer, and a second ground layer formed so as to confront said second wire pattern layer so that a second insulating layer corresponding to a part of said insulating layer is sandwiched between said second ground layer and said second wire pattern layer, said first ground layer and said second ground layer being confronted to each other so that a third insulating layer corresponding to a part of said insulating layer is sandwiched therebetween, whereby said circuit board is formed as a four layered circuit board having said first wire pattern layer, said second wire pattern layer, said first ground layer and said second ground layer.

2. The tuner apparatus as claimed in claim 1, wherein said first tuner portion and said second tuner portion are disposed so as not to be confronted to each other through said circuit board.

3. The tuner apparatus as claimed in claim 2, wherein said first tuner portion and said second tuner portion are provided substantially adjacent respective opposite ends of said circuit board.

4. The tuner apparatus as claimed in claim 1, wherein said four layered circuit board is formed by attaching a first circuit board comprising said first wire pattern layer, said first insulating layer and said first ground layer and a second circuit board comprising said second wire pattern layer, said second insulating layer and said second ground layer onto both surfaces of said third insulating layer.

5. A receiver apparatus comprising:
   a tuner apparatus in which a first tuner portion for receiving a first broadcast wave and outputting first transport stream data achieved by multiplexing encoded data on sounds and/or pictures contained in the first broadcast wave is provided on one surface of a circuit board, and a second tuner portion for receiving a second broadcast wave different from the first broadcast wave and outputting second transport stream data achieved by multiplexing encoded data on sounds and/or pictures contained in the second broadcast wave is provided on a reverse surface of said circuit board;
   decoding means for decoding the first transport stream data and the second transport stream data; and
   an output terminal for supplying the first and second transport stream data decoded by the decoding means to a display device for outputting sounds and/or pictures,
   wherein a first wire pattern for transmitting the first transport stream data is formed on the surface of said circuit board on which said first tuner portion is provided, and a second wire pattern for transmitting the second transport stream data is formed on the reverse surface of said circuit board on which said second tuner portion is provided,
   wherein said circuit board has a first wire pattern layer on which said first wire pattern is formed, a second wire pattern layer on which said second wire pattern is formed, and an insulating layer sandwiched between said first wire pattern layer and said second wire pattern layer, and at least one ground layer for intercepting undesired radiation noises of said first tuner portion and said second tuner portion formed on said insulating layer, and
   wherein said ground layer has a first ground layer formed so as to confront said first wire pattern layer so that a first insulating layer corresponding to a part of said insulating layer is sandwiched between said first ground layer and said first wire pattern layer, and a second ground layer formed so as to confront said second wire pattern layer so that a second insulating layer corresponding to a part of said insulating layer is sandwiched between said second ground layer and said second wire pattern layer, said first ground layer and said second ground layer being confronted to each other so that a third insulating layer corresponding to a part of said insulating layer is sandwiched therebetween, whereby said circuit board is formed as a four layered circuit board having said first wire pattern layer, said second wire pattern layer, said first ground layer and said second ground layer.

6. The receiver apparatus as claimed in claim 5, further comprising:

selecting means for selecting at least one of the first transport stream data and the second transport stream data; and recording means for recording at least one of the first transport stream data and the second transport stream data selected by said selecting means.

* * * * *